United States Patent
Kaiser

(10) Patent No.: US 11,936,538 B2
(45) Date of Patent: Mar. 19, 2024

(54) PHASE-SHIFTED SAMPLING MODULE AND METHOD FOR DETERMINING FILTER COEFFICIENTS

(71) Applicant: Rohde & Schwarz GmbH & Co. KG, Munich (DE)

(72) Inventor: Cornelius Kaiser, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 183 days.

(21) Appl. No.: 17/551,424

(22) Filed: Dec. 15, 2021

(65) Prior Publication Data

US 2022/0239570 A1   Jul. 28, 2022

(30) Foreign Application Priority Data

Jan. 22, 2021   (EP) .................................. 21152966

(51) Int. Cl.
*H04L 43/028* (2022.01)
*H03M 1/12* (2006.01)

(52) U.S. Cl.
CPC ......... *H04L 43/028* (2013.01); *H03M 1/1245* (2013.01)

(58) Field of Classification Search
CPC . H04L 43/028; H03M 1/0614; H03M 1/0626; H03M 1/0656; H03M 1/1245; H03M 1/1215

See application file for complete search history.

(56) References Cited

U.S. PATENT DOCUMENTS

| | | | |
|---|---|---|---|
| 5,239,299 A | 8/1993 | Apple et al. | |
| 6,653,959 B1 * | 11/2003 | Song | H03M 1/121 341/131 |
| 7,394,415 B2 | 7/2008 | Fuse et al. | |
| 7,408,495 B1 | 8/2008 | Stein et al. | |
| 8,009,070 B2 | 8/2011 | Johansson et al. | |

(Continued)

FOREIGN PATENT DOCUMENTS

| | | |
|---|---|---|
| CN | 103580693 A | 2/2014 |
| EP | 2690787 A2 | 1/2014 |
| JP | 6508665 B2 | 5/2019 |

OTHER PUBLICATIONS

Asemani, D., et al., "Subband architecture for Hybrid Filter Bank A/D converters," IEEE Journal of Selected Topics in Signal Processing; 2:2; Apr. 2008, pp. 1-10.

(Continued)

*Primary Examiner* — Rasheed Gidado
(74) *Attorney, Agent, or Firm* — Christensen O'Connor Johnson Kindness PLLC

(57) ABSTRACT

A phase-shifted sampling circuit is described. The phase-shifted sampling circuit includes a primary sampler circuit, an ADC circuit, and an equalization circuit. The primary sampler circuit includes an analog signal input, a first signal path, and a second signal path. The equalization circuit includes a primary sampler equalizer sub-circuit. The primary sampler equalizer sub-circuit is configured to compensate a mismatch between a transfer function associated with the first signal path and a transfer function associated with the second signal path. Further, a method of determining filter coefficients of an equalization circuit of a phase-shifted sampling circuit is described.

20 Claims, 5 Drawing Sheets

(56) References Cited

U.S. PATENT DOCUMENTS

| | | | | |
|---|---|---|---|---|
| 8,164,496 | B2* | 4/2012 | Velazquez | H03F 1/3247 |
| | | | | 455/295 |
| 8,698,659 | B2 | 4/2014 | Hovakimyan et al. | |
| 8,823,559 | B2* | 9/2014 | Tassart | H04L 1/0002 |
| | | | | 341/51 |
| 9,143,147 | B1 | 9/2015 | Ray et al. | |
| 9,564,979 | B2* | 2/2017 | Yang | H04B 17/11 |
| 10,382,073 | B2* | 8/2019 | Singerl | H03F 1/3294 |
| 10,749,541 | B1* | 8/2020 | Stein | H03M 1/0626 |
| 10,892,763 | B1* | 1/2021 | Hidaka | H03L 7/087 |
| 2007/0262895 | A1 | 11/2007 | Stein et al. | |
| 2010/0289544 | A1* | 11/2010 | Lee | H04L 7/0331 |
| | | | | 327/159 |

OTHER PUBLICATIONS

De Teyou, G.K., et al., "Adaptive and Digital Blind Calibration of Transfer Function Mismatch in Time-Interleaved ADCs," Télécom ParisTech, France, IEEE Xplore, downloaded Oct. 28, 2020, 4 pages.

Kwon, S. and H. Bae, "Variable-Precision Distributed Arithmetic (VPDA) MIMO Equalizer for Power-and-Area-Efficient 112 GB/s Optical DP-QPSK Systems," Journal of Lightwave Technology; 31:2; Jan. 15, 2013, pp. 282-294.

Lim Y.C. et al., "Time-Interleaved Analog-to-Digital-Converter Compensation Using Multichannel Filters," IEEE Transactions on Circuits and Systems-I: Regular Papers; 56:10, Oct. 2009, pp. 2234-2247.

Ui, W. and Y. Chiu, "Time-Interleaved Analog-to-Digital Conversion With Online Adaptive Equalization," IEEE Transactions on Circuits and Systems-I: Regular Papers; 59:7; Jul. 2012, pp. 1384-1395.

Satarzadeh, P. et al., "Bandwidth Mismatch Correction for a Two-Channel Time-Interleaved A/D Converter," Circuits and Systems, ISCAS 2007, IEEE International Symposium, O.N., 5 pages.

Seo, M. et al., "Comprehensive Digital Correction of Mismatch Errors for a 400-Msamples/s 80-dB SFDR Time-Interleaved Analog-to-Digital Converter," IEEE Transactions on Microwave Theory and Techniques; 53:3, Mar. 2005, pp. 1072-1082.

* cited by examiner

PHASE-SHIFTED SAMPLING MODULE AND METHOD FOR DETERMINING FILTER COEFFICIENTS

FIELD OF THE DISCLOSURE

Embodiments of the present disclosure generally relate to phase-shifted sampling circuits. Embodiments of the present disclosure further relate to measurement instruments and to methods of determining filter coefficients of an equalization circuit of a phase-shifted sampling circuit.

BACKGROUND

In order to achieve high sampling rates that exceed the sampling rate of a single analog-to-digital converter (ADC), it is known to use two or more ADCs that sample the corresponding signal in a phase-shifted manner.

The partial signals sampled by the individual ADCs are recombined into a single digitized signal, such that an integer multiple of the sampling rate of the individual ADCs is achieved.

If signals with a large bandwidth are to be digitized, such phase-shifted sampling circuits usually use ADCs that each have a large bandwidth. However, large-bandwidth ADCs are rather costly.

Thus, there is a need for a phase-shifted sampling circuit that can be produced at reduced costs while maintaining the quality of the digitized signal.

SUMMARY

Embodiments of the present disclosure provide phase-shifted sampling circuits. In an embodiment, a phase-shifted sampling circuit comprises a primary sampler circuit, an ADC circuit, and an equalization circuit. The primary sampler circuit comprises an analog signal input, a first signal path, and a second signal path. The first signal path comprises a first analog sampling unit configured to sample an analog input signal received by the analog signal input, thereby generating a first pre-sampled analog input signal. The second signal path comprises a second analog sampling unit configured to sample the analog input signal in a phase-shifted manner compared to the first analog sampling unit, thereby generating a second pre-sampled analog input signal. The ADC circuit comprises a first analog-to-digital converter associated with the first signal path, wherein the first analog-to-digital converter is configured to sample the first pre-sampled analog input signal, thereby generating a first digital output signal. The ADC circuit comprises a second analog-to-digital converter associated with the second signal path, wherein the second analog-to-digital converter is configured to sample the second pre-sampled analog input signal in a phase-shifted manner compared to the first analog-to-digital converter, thereby generating a second digital output signal. The equalization circuit comprises a primary sampler equalizer sub-circuit. The primary sampler equalizer sub-circuit is configured to compensate a mismatch between a transfer function associated with the first signal path and a transfer function associated with the second signal path based on the digital output signals.

In general, the primary sampler circuit may have M signal paths, wherein M is an integer bigger than or equal to 2. Accordingly, the ADC circuit may comprise M analog-to-digital converters, wherein each of the analog-to-digital converters is associated with one of the M signal paths.

Without restriction of generality, the case M=2 is described in the following.

The first analog sampling unit and the second analog sampling unit sample the analog input signal in a phase shifted manner with respect to each other. In other words, the analog sampling units sample the same analog input signal, but at different sampling times. Thus, the phase-shifted sampling takes place.

The resulting pre-sampled analog input signals are converted by the analog-to-digital converters (ADCs), and the digital output signals of the ADCs may be recombined downstream of the ADCs, thereby obtaining a digital version of the analog input signal that is sampled at a higher sampling rate than achievable with only a single ADC.

According to an embodiment of the present disclosure, the primary sampler circuit is provided that reduces the bandwidth of the analog input signal. For example, the first analog sampling unit and the second analog sampling unit reduce the bandwidth of the analog input signal. In other words, the first pre-sampled analog input signal and the second pre-sampled analog input signal each have a lower bandwidth than the analog input signal.

Thus, the ADCs each can have a lower bandwidth. Accordingly, cheaper ADCs can be used. The reduced costs of the ADCs overweigh the additional costs of the primary sampler circuit (which can be produced cost-efficiently), such that the overall production costs of the phase-shifted sampling circuit are reduced.

Due to (unavoidable) mismatches of real systems, the first signal path and the second signal path of the primary sampler circuit do not behave identically. This can cause unwanted disturbances in the digital output signals.

The present disclosure is further based on the idea to compensate the transfer function mismatches between the first signal path and the second signal path by filtering the digital output signals of the analog-to-digital converters by the primary equalizer sub-circuit.

For example, the primary sampler equalizer sub-circuit is configured to compensate transfer function mismatches between the analog signal paths within the primary sampler circuit.

In other words, the primary sampler equalizer sub-circuit is configured to remove unwanted signal perturbations caused by the transfer function mismatches between the signal paths from the digital output signals. This way, digital output signals with reduced perturbations are obtained.

According to an aspect of the present disclosure, the primary sampler equalizer sub-circuit is established as a linear periodic time variant (LPTV) filter. Thus, time variant perturbations in the digital output signals caused by time variant transfer function mismatches between the first signal path and the second signal path can be compensated by the primary sampler equalizer sub-circuit. In other words, perturbations that vary over time can be compensated by the primary sampler equalizer sub-circuit.

According to another aspect of the present disclosure, the primary sampler equalizer sub-circuit comprises at least two inputs and at least two outputs, wherein the primary sampler equalizer sub-circuit comprises filter units connecting each input with each output. In some embodiments, the filter units are established as FIR filter units. In general, a first one of the two inputs is associated with the first signal path, while a second one of the two inputs is associated with the second signal path.

A first one of the two outputs may be connected to the first input by a first filter unit. Moreover, the first output may be connected to the second input by a second filter unit. Thus, signals received by the first input and the second input are filtered by the first filter unit and the second filter unit, respectively, and the corresponding filtered signals are forwarded to the first output. In some embodiments, the corresponding filtered signals are superposed.

A second one of the two outputs may be connected to the first input by a third filter unit. Moreover, the second output may be connected to the second input by a fourth filter unit. Thus, signals received by the first input and the second input are filtered by the third filter unit and the fourth filter unit, respectively, and the corresponding filtered signals are forwarded to the second output. In some embodiments, the corresponding filtered signals are superposed.

In a further embodiment of the present disclosure, the equalization circuit comprises an ADC equalizer sub-circuit and/or an overall equalizer sub-circuit. The ADC equalizer sub-circuit is configured to compensate transfer function mismatches within the ADC circuit and/or transfer function mismatches in a connection path between the primary sampler circuit and the ADC circuit. The overall equalizer sub-circuit is configured to compensate transfer function mismatches originating upstream of the primary sampler circuit.

Therein, the "connection path between the primary sampler circuit and the ADC circuit" is understood to comprise all components downstream of the primary sampler circuit and upstream of the ADC circuit, e.g., connecting wires. These components may have a different (electrical) length, such that transfer function mismatches may be introduced by them. The ADC equalizer sub-circuit may be configured to compensate these mismatches.

The ADC equalizer sub-circuit may comprise a first ADC filter unit associated with the first signal path, and a second ADC filter unit associated with the second signal path. Accordingly, the first ADC filter unit may filter the first digital output signal (only), and the second ADC filter unit may filter the second digital output signal (only). Put differently, each digital output signal is filtered by a dedicated ADC filter unit.

In some embodiments, the first ADC filter unit and the second ADC filter unit may each be established as a linear time invariant filter, for example as a finite impulse response filter (FIR filter). While the individual ADC filter units may be established as time invariant filters, the ADC equalizer sub-circuit as a whole may be configured as a time variant filter, such that time variant perturbations can be removed by the ADC equalizer sub-circuit.

The overall equalizer sub-circuit may be established as a linear time invariant filter, for example as an FIR filter.

According to an aspect of the present disclosure, the ADC equalizer sub-circuit is provided upstream of the primary sampler equalizer sub-circuit, for example immediately upstream of the primary sampler equalizer sub-circuit.

According to a further aspect of the present disclosure, the overall equalizer sub-circuit is provided downstream of the primary sampler equalizer sub-circuit.

In some embodiments, the individual sub-circuits of the equalization circuit may be arranged in inverse order with respect to the sources of transfer function mismatches. Accordingly, the ADC equalizer sub-circuit may be arranged immediately downstream of the ADC circuit. The primary sampler equalizer sub-circuit may be arranged (immediately) downstream of the ADC equalizer sub-circuit. The overall equalizer sub-circuit may be arranged downstream of the primary sampler equalizer sub-circuit.

In a further embodiment of the present disclosure, filter coefficients of the equalizer sub-circuits are obtained by a variation of a global cost functional, wherein the global cost functional depends on the filter coefficients of the individual equalizer sub-circuits. In general, the variation of the global cost functional corresponds to a non-linear optimization, as there may be no linear correlation between the filter coefficients of the equalizer sub-circuits and the input signal. The global cost functional may depend on a reference signal, namely an ideal reconstructed signal. The cost functional may further depend on the input signal and an equalized output signal, i.e., on a signal processed by the equalization circuit.

In some embodiments, the global cost functional corresponds to an error measure between an ideal output signal, i.e. the reference signal, and the equalized output signal, i.e., the signal processed by the equalization circuit.

According to another aspect of the present disclosure, starting coefficients for the variation of the global cost functional are obtained by local variations of local cost functionals being associated with the individual equalizer sub-circuits. In other words, a first optimization is performed for the equalizer sub-circuits individually. The results of this first optimization, i.e., preliminary filter coefficients for the equalizer sub-circuits, may then be used for a second optimization, namely the variation of the global cost functional.

The individual local cost functionals may depend on filter coefficients of the respective equalizer sub-circuit, on a reference signal (i.e., an ideal output signal of the respective equalizer sub-circuit), and on an actual output signal of the respective equalizer sub-circuit.

In some embodiments, the local cost functionals correspond to an error measure between an ideal output signal, i.e., the reference signal, and the actual output signal of the respective equalizer sub-circuit.

The variation may be performed by a least squares technique. However, it is to be understood that any other suitable optimization technique may be employed.

In a further embodiment of the present disclosure, the phase-shifted sampling circuit comprises an output selector circuit configured to selectively output a signal associated with the first signal path or with the second signal path, for example in an alternating manner. In general, the output selector circuit is configured to recombine the digital output signals of the ADCs after the digital output signals have been filtered by the ADC equalizer sub-circuit and the primary sampler equalizer sub-circuit. The resulting digital output signal is sampled at a higher sampling rate than achievable by a single ADC.

The output selector circuit may be arranged downstream of the primary sampler equalizer sub-circuit, for example immediately downstream of the primary sampler equalizer sub-circuit. In other words, the output selector circuit may receive the output signals generated by the primary sampler equalizer sub-circuit, i.e., filtered digital output signals that have already been corrected for the transfer function mismatches between the first signal path and the second signal path.

Alternatively or additionally, the output selector circuit is arranged upstream of the overall equalizer sub-circuit, for example immediately upstream of the overall equalizer sub-circuit.

According to an aspect of the present disclosure, the primary sampler equalizer sub-circuit has a structure resembling the structure of the primary sampler circuit, for example a tree-like structure. For example, the structure of the primary sampler equalizer sub-circuit may be a mirror image of the structure of the primary sampler circuit. It has turned out that a particularly resource-efficient compensation of the transfer function mismatches between the signal paths of the primary sampler circuit is obtained in this way.

In some embodiments, individual filter units of the primary sampler equalizer sub-circuit may be arranged in a tree-like structure. For example, the individual filter units may be established as linear 2-periodic time variant (2-LPTV) filters.

The primary sampler equalizer sub-circuit may have a single filter structure being associated with all signal paths, for example a single linear n-periodic time variant filter. It has turned out that transfer function mismatches occurring between individual stages of the primary sampler circuit can be compensated in this way, as the single filter structure is linked to all signal paths.

Therein, n is an integer bigger than or equal to 2. In some embodiments, n may be equal to M, i.e., to the number of signal paths of the primary sampler circuit.

In some embodiments, the analog sampling units are established as sample & hold units (S&H units), as track & hold units (T&H units), or as return-to-zero sampling units (RZ sampling units). The difference between a sample & hold unit and a return-to-zero sampling unit lies in that the sample & hold unit keeps the signal at the sampled signal level for the whole sampling period, while the return-to-zero sampling unit returns the signal level to zero within the sampling period. It has turned out that return-to-zero sampling units are particularly suitable for primary samplers operating at high sampling rates, i.e. above 10 MS/s, for example above 100 MS/s, in particular above 1 GS/s.

Embodiments of the present disclosure further provide a measurement instrument that comprises the phase-shifted sampling circuit described above. In some embodiments, the measurement instrument is established as an oscilloscope. For example, the measurement instrument may be established as a digital oscilloscope.

Regarding the advantages and further properties of the measurement instrument, reference is made to the explanations given above with respect to the phase-shifted sampling circuit, which also hold for the measurement instrument and vice versa.

Embodiments of the present disclosure further provide methods of determining filter coefficients of an equalization circuit of a phase-shifted sampling circuit described above. In an embodiment, the equalization circuit comprises an ADC equalizer sub-circuit configured to compensate transfer function mismatches within the ADC circuit and/or an overall equalizer sub-circuit configured to compensate transfer function mismatches originating upstream of the primary sampler circuit. In an embodiment, the method comprises the following steps: receiving an input signal; processing the input signal by means of the primary sampler circuit and the ADC circuit, thereby obtaining at least a first digital output signal and a second digital output signal; processing the first digital output signal and the second digital output signal by the equalization circuit, thereby obtaining an equalized output signal; providing a global cost functional that depends on filter coefficients of the individual equalizer sub-circuits, the input signal, and the equalized output signal; and determining the filter coefficients of the equalizer sub-circuits by a global variation of the global cost functional.

In general, the variation of the global cost functional corresponds to a non-linear optimization, as there may be no linear correlation between the filter coefficients of the equalizer sub-circuits and the input signal. The global cost functional may depend on a reference signal, namely an ideal reconstructed signal. The cost functional may further depend on the input signal and an equalized output signal, i.e., on a signal processed by the equalization circuit.

In some embodiments, the global cost functional corresponds to an error measure between an ideal output signal, i.e., the reference signal, and the equalized output signal, i.e., the signal processed by the equalization circuit.

Regarding the further advantages and properties of the method, reference is made to the explanations given above with respect to the phase-shifted sampling circuit, which also hold for the method and vice versa.

According to an aspect of the present disclosure, starting coefficients for the variation of the global cost functional are obtained by means of local variations of local cost functionals associated with the individual equalizer sub-circuits. In other words, a first optimization is performed for the equalizer sub-circuits individually. The results of this first optimization, i.e., preliminary filter coefficients for the equalizer sub-circuits, may then be used for a second optimization, namely the variation of the global cost functional.

The individual local cost functionals may depend on filter coefficients of the respective equalizer sub-circuit, on a reference signal (i.e., an ideal output signal of the respective equalizer sub-circuit), and on an actual output signal of the respective equalizer sub-circuit.

In some embodiments, the local cost functionals correspond to an error measure between an ideal output signal, i.e., the reference signal, and the actual output signal of the respective equalizer sub-circuit.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
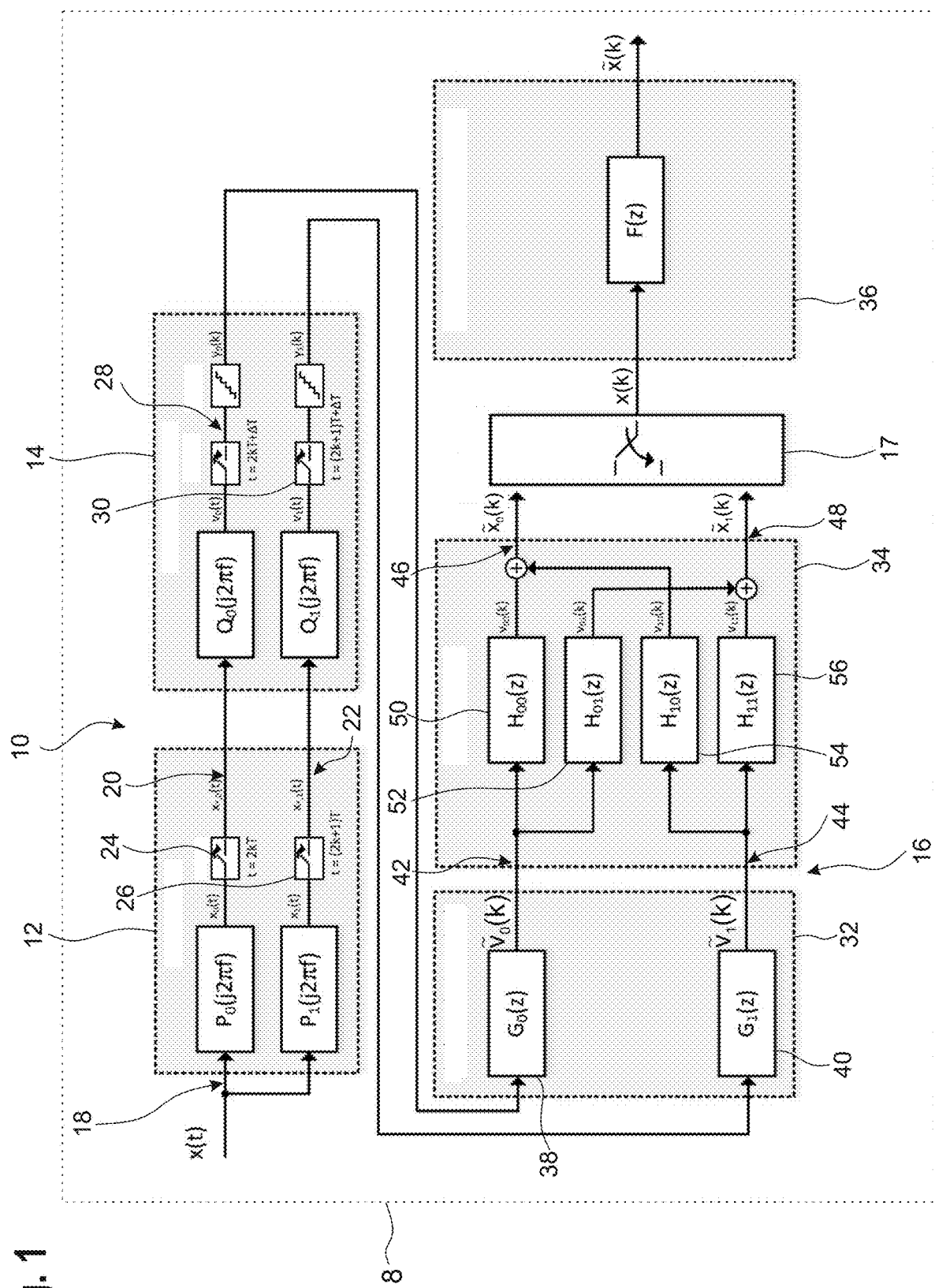
FIG. 1 schematically shows a phase-shifted sampling circuit according to an embodiment of the present disclosure.

FIG. 1 schematically shows a representative measurement instrument 8 that comprises an example of a phase-shifted sampling circuit 10. The measurement instrument 8 may be established as an oscilloscope. For example, the measurement instrument 8 may be established as a digital oscilloscope. However, it is to be understood that the phase-shifted sampling circuit 10 described below may also be used in another type of electronic device.

As shown in the embodiment of FIG. 1, the phase-shifted sampling circuit 10 comprises a primary sampler circuit 12, an ADC circuit 14, an equalization circuit 16, and an output selector circuit 17. In the shown embodiment, the primary sampler circuit 12 comprises an analog signal input 18, a first signal path 20, and a second signal path 22. In general, the primary sampler circuit 12 may have M signal paths, wherein M is an integer bigger than or equal to 2.

The first signal path 20 comprises a first analog sampling unit 24 configured to sample an analog input signal received by the analog signal input 18. The second signal path 22 comprises a second analog sampling unit 26 configured to sample the analog input signal in a phase-shifted manner compared to the first analog sampling unit 24. The analog sampling units 24, 26 are each established as a sample & hold unit, as a track & hold unit, or as a return-to-zero sampling unit.

In some embodiments, the term "module," "unit," etc., refers to or includes, inter alia, a combination of hardware (e.g. a processor such as an integrated circuit, digital circuits or other circuitry) and software (e.g. machine- or processor-executable instructions, commands, or code such as firmware, programming, or object code). Furthermore, a combination of hardware and software may include hardware only (i.e. a hardware element with no software elements), software hosted at hardware (e.g. software that is stored at a memory and executed or interpreted at a processor), or hardware with the software hosted thereon. In some embodiments, the hardware may, inter alia, comprise a CPU, a GPU, an FPGA, an ASIC, or other types of electronic circuitry. In some embodiments, hardware may include analog and/or digital circuitry.

In the shown embodiment, the ADC circuit 14 comprises a first analog-to-digital converter 28 associated with the first signal path 20 and a second analog-to-digital converter 30 associated with the second signal path 22 of the primary sampler circuit 12. In general, the ADC circuit 14 may comprise M analog-to-digital converters, wherein each of the analog-to-digital converters is associated with one of the M signal paths of the primary sampler circuit 12. Hence, each signal path may be associated with a dedicated analog-to-digital converter. Without restriction of generality, the case M=2 is described in the following.

In some embodiments, the equalization circuit 16 comprises an ADC equalizer sub-circuit 32, a primary sampler equalizer sub-circuit 34, and an overall equalizer sub-circuit 36. The ADC equalizer sub-circuit 32 is arranged immediately downstream of the ADC circuit 14.

The ADC equalizer sub-circuit 32 comprises a first ADC filter unit 38 being associated with the first signal path 20, and a second ADC filter unit 40 being associated with the second signal path 22. The first ADC filter unit 38 and the second ADC filter unit 40 may each be established as a linear time invariant filter, for example as an FIR filter. While the individual ADC filter units 38, 40 may be established as time invariant filters, the ADC equalizer sub-circuit 32 as a whole may be configured as a time variant filter, such that time variant perturbations can be removed by the ADC equalizer sub-circuit 32.

The primary sampler equalizer sub-circuit 34 is arranged immediately downstream of the ADC equalizer sub-circuit 32. In some embodiments, the primary sampler equalizer sub-circuit 34 comprises a first input 42, a second input 44, a first output 46, and a second output 48.

The first input 42 is connected with the first output 46 via a first filter unit 50. Moreover, the first input 42 is connected with the second output 48 via a second filter unit 52. The second input 44 is connected with the first output 46 via a third filter unit 54. Moreover, the second input 44 is connected with the second output 48 via a fourth filter unit 56.

In general, the primary sampler equalizer sub-circuit 34 may be established as a linear periodic time variant (LPTV) filter. In some embodiments, the individual filter units 50, 52, 54, 56 may be established as FIR filter units.

The output selector circuit 17 is arranged immediately downstream of the primary sampler equalizer sub-circuit 34. The overall equalizer sub-circuit 36 is arranged immediately downstream of the output selector circuit 17. The overall equalizer sub-circuit 36 may be established as a linear time invariant filter, for example as an FIR filter.

The phase-shifted sampling circuit 10 is configured to perform a phase-shifted sampling method, such as one described in the following with reference to the example shown in FIG. 2.

Figure 2:
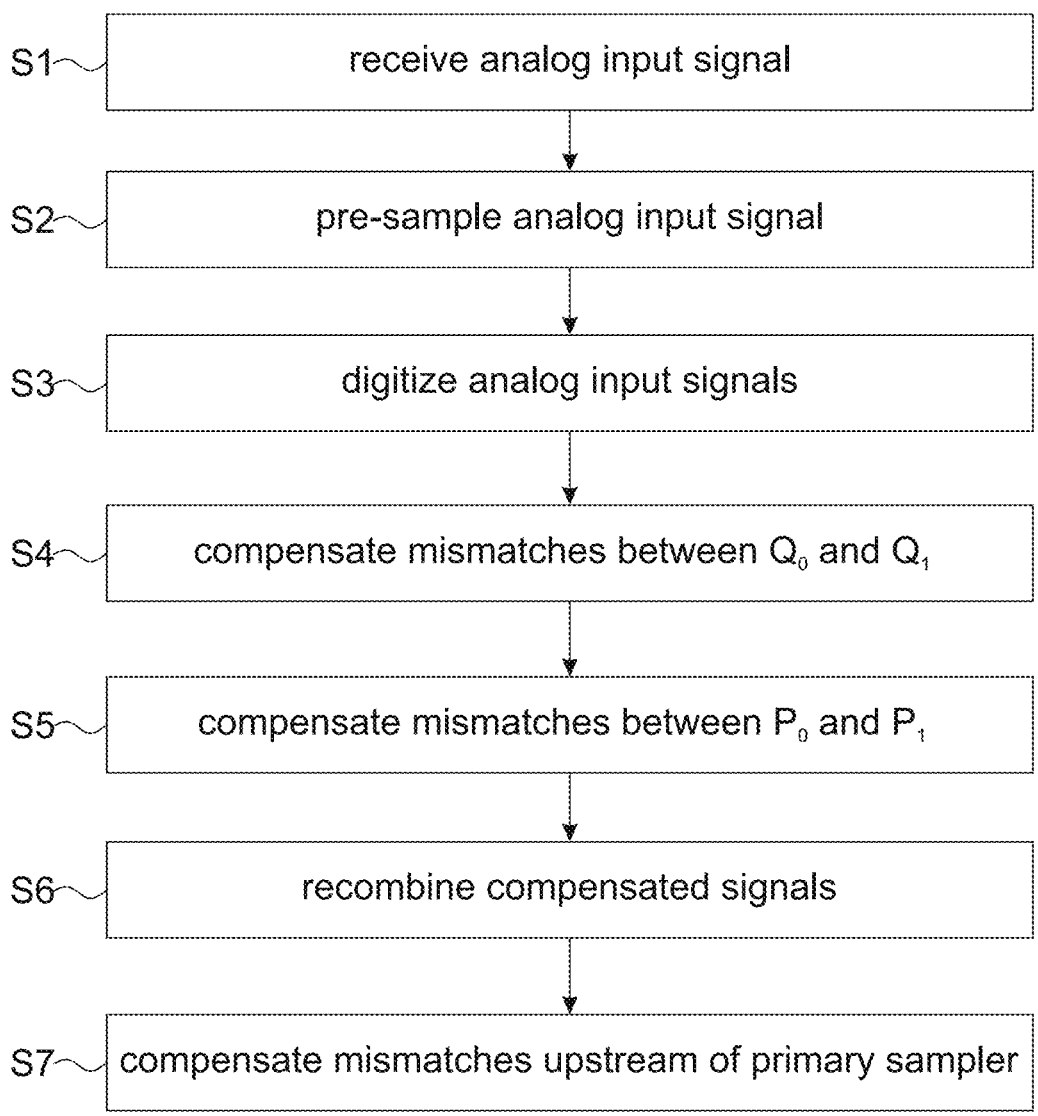
FIG. 2 shows a representative flow chart of a phase-shifted sampling method according to an embodiment of the present disclosure.

As shown in FIG. 2, an analog input signal x(t) is received by the analog signal input 18 (step S1).

The analog input signal is forwarded to the first sampling unit 24 and to the second sampling unit 26 via the first signal path 20 and the second signal path 22, respectively. Usually, the two signal paths 20, 22 are not completely identical, and thus have transfer functions that are not completely identical.

Thus, the first sampling unit 24 receives an analog input signal $x_0(t)$ due to the transfer function $P_0(j2\pi f)$ of the first signal path 20. The second sampling unit 26 receives an analog input signal $x_1(t)$ due to the transfer function $P_1(j2\pi f)$ of the second signal path 22, wherein in general $x_1(t) \neq x_0(t)$ due to $P_1(j2\pi f) \neq P_0(j2\pi f)$. Accordingly, there may be a transfer function mismatch between the first signal path 20 and the second signal path 22 within the primary sampler circuit 12.

The analog input signals $x_0(t)$, $x_1(t)$ are sampled by the sampling units 24, 26, thereby generating a first pre-sampled analog input signal $x_{*,0}(t)$ and a second pre-sampled analog input signal $x_{*,1}(t)$, respectively (step S2). The sampling units 24, 26 each operate with a sampling frequency $f_s=1/(2T)$. However, the first sampling unit 24 samples the analog input signal x(t) in a phase-shifted manner compared to the second sampling unit 26.

In some embodiments, the first sampling unit 24 samples the analog input signal $x_0(t)$ at sample times t=2 kT, while the second sampling unit 26 samples the analog input signal $x_1(t)$ at sample times t=(2k+1)T, wherein, k is an integer. In other words, the two sampling units 24 sample the input signal x(t) alternately.

The first pre-sampled analog input signal $x_{*,0}(t)$ and the second pre-sampled analog input signal $x_{*,1}(t)$ are forwarded to the first ADC 28 and to the second ADC 30, respectively. In general, a connection path between the first sampling unit 24 and the first ADC 28 may be different from the connection path between the second sampling unit 26 and the second ADC 30. Accordingly, the two connection paths may have different transfer functions.

Therein, the term "connection path" is understood to comprise all components downstream of the primary sampler circuit 12 and upstream of the ADC circuit 14, e.g., connecting wires.

Moreover, signal paths within the ADC circuit 14 may also have transfer functions that are different from each other.

In FIG. 1, the overall effect of the connection paths and the signal paths within the ADC circuit 14 is summarized in the transfer functions $Q_0(j2\pi f)$ and $Q_1(j2\pi f)$. As a result of the transfer function $Q_0(j2\pi f)$, the first ADC 28 receives a modified version $v_0(t)$ of the first pre-sampled input signal (t). Similarly, the second ADC 30 receives a modified version $v_1(t)$ of the second pre-sampled input signal $x_{*,1}(t)$ due to the transfer function $Q_1(j2\pi f)$.

The ADCs 28, 30 digitize the pre-sampled analog input signals $v_0(t)$, $v_1(t)$, thereby obtaining a first digital output signal $y_0(k)$ and a second digital output signal $y_1(k)$, respectively (step S3). The ADCs 28, 30 each operate with a sampling frequency $f_s=1/(2T)$, for example wherein the sampling frequency of the ADCs 28, 30 matches the sampling frequency of the sampling units 24, 26.

However, the first ADC 28 samples the first pre-sampled analog input signal $v_0(t)$ in a phase-shifted manner compared to the second ADC 30 sampling the second pre-sampled analog input signal $v_1(t)$. For example, first ADC 28 samples the first pre-sampled analog input signal $v_0(t)$ at sample times $t=2kT+\Delta T$, while the second ADC 30 samples the second pre-sampled analog input signal $v_1(t)$ at sample times $t=(2k+1)T+\Delta T$, wherein k is an integer and $\Delta T$ is a time shift accounting for the propagation time of the signals from the sampling units 24, 26 to the ADCs 28, 30.

The digital output signals $y_0(k)$, $y_1(k)$ are forwarded to the equalization circuit 16, or to the ADC equalizer sub-circuit 32 in some embodiments. Mismatches between the transfer functions $Q_0(j2\pi f)$, $Q_1(j2\pi f)$ are compensated by the ADC equalizer sub-circuit 32 (step S4). Thus, the ADC equalizer sub-circuit 32 compensates transfer function mismatches originating within the ADC circuit 14 and in a connection path between the primary sampler circuit 12 and the ADC circuit 14.

For example, the first ADC filter unit 38 filters the first digital output signal $y_0(k)$, thereby generating a first filtered digital output signal $\tilde{v}_0(k)$. The second ADC filter unit 40 filters the second ADC filter unit 40 filters the second digital output signal $y_1(k)$, thereby generating a second filtered digital output signal $\tilde{v}_1(k)$.

Therein, transfer functions $G_0(z)$ and $G_1(z)$ of the ADC filter units 38, 40 are chosen such that the mismatches between the transfer functions $Q_0(j2\pi f)$, $Q_1(j2\pi f)$ are compensated. In other words, filter coefficients of the ADC equalizer sub-circuit 32 are chosen such that the mismatches between the transfer functions $Q_0(j2\pi f)$, $Q_1(j2\pi f)$ are compensated.

The sampling times of the first ADC 28 and/or of the second ADC 30, i.e., the times at which samples are taken by the first ADC 28 and/or the second ADC 30), may deviate from respective ideal sampling times. These deviations from the ideal sampling times are reflected in deviations of phase responses associated with the transfer functions $Q_0(j2\pi f)$, $Q_1(j2\pi f)$, as the transfer functions $Q_0(j2\pi f)$, $Q_1(j2\pi f)$ also comprise information on the respective phase response.

The transfer functions $G_0(z)$ and $G_1(z)$ of the ADC filter units 38, 40 may be chosen such that the deviations of the sampling times of the ADCs 28, 30 from the respective ideal sampling times are compensated. In other words, filter coefficients of the ADC equalizer sub-circuit 32 may be chosen such that the deviations of the sampling times of the ADCs 28, 30 from the respective ideal sampling times are compensated.

Accordingly, in the case of perfect reconstruction, it holds $\tilde{v}_0(k)=v_0(t)$ for $t=2kT+\Delta T$ and $\tilde{v}_1(k)=v_1(t)$ for $t=(2k+1)T+\Delta T$. This will be explained in more detail below.

The filtered digital output signals $\tilde{v}_0(k)$, $\tilde{v}_1(k)$ are forwarded to the first input 42 and to the second input 44 of the primary sampler equalizer sub-circuit 34, respectively.

Mismatches between the transfer functions $P_0(j2\pi f)$, $(j2\pi f)$ are compensated by the primary sampler equalizer sub-circuit 34 (step S5). Thus, the primary sampler equalizer sub-circuit 34 compensates transfer function mismatches originating within the primary sampler circuit 12.

Therein, transfer functions $H_{00}(z)$, $H_{01}(z)$, $H_{10}(z)$, and $H_{11}(z)$ of the filter units 50, 52, 55, 56 are chosen such that the mismatches between the transfer functions $P_0(j2\pi f)$, $P_1(j2\pi f)$ are compensated. In other words, filter coefficients of the primary sampler equalizer sub-circuit 34 are chosen such that the mismatches between the transfer functions $P_0(j2\pi f)$, $P_1(j2\pi f)$ are compensated.

The sampling times of the first sampling unit 24 and/or of the second sampling unit 26, i.e., the times at which samples are taken by the first sampling unit 24 and/or the second sampling unit 26, may deviate from respective ideal sampling times. These deviations from the ideal sampling times are reflected in deviations of phase responses associated with the transfer functions $P_0(j2\pi f)$, $P_1(j2\pi f)$, as the transfer functions $P_0(j2\pi f)$, $P_1(j2\pi f)$ also comprise information on the respective phase response.

The transfer functions $H_{00}(z)$, $H_{01}(z)$, $H_{10}(z)$, and $H_{11}(z)$ of the filter units 50, 52, 55, 56 may be chosen such that the deviations of the sampling times of the sampling units 24, 26 from the respective ideal sampling times are compensated. In other words, filter coefficients of the primary sampler equalizer circuit 34 may be chosen such that the deviations of the sampling times of the sampling units 24, 26 from the respective ideal sampling times are compensated.

For example, the first filter unit 50 filters the first filtered digital output signal $\tilde{v}_0(k)$, thereby generating a first intermediate signal $v_{00}(k)$. The second filter unit 52 filters the first filtered digital output signal $\tilde{v}_0(k)$, thereby generating a second intermediate signal $v_{01}(k)$. The third filter unit 54 filters the second filtered digital output signal $\tilde{v}_1(k)$, thereby generating a third intermediate signal $v_{10}(k)$. The fourth filter unit 56 filters the second filtered digital output signal $\tilde{v}_1(k)$, thereby generating a fourth intermediate signal $v_{11}(k)$.

The first intermediate signal $v_{00}(k)$ and the third intermediate signal $v_{10}(k)$ are superposed, thereby generating a first compensated digital output signal $\tilde{x}_0(k)$ being associated with the first output 46. The second intermediate signal $v_{01}(k)$ and the fourth intermediate signal $v_{11}(k)$ are superposed, thereby generating a second compensated digital output signal $\tilde{x}_1(k)$ being associated with the second output 48.

Accordingly, in the case of perfect reconstruction, it holds $\tilde{x}_0(k)=x_0(t)$ for $t=2kT$ and $\tilde{x}_1(k)=x_1(t)$ for $t=(2k+1)T$. This will be explained in more detail below.

The compensated digital output signals $\tilde{x}_0(k)$, $\tilde{x}_1(k)$ are forwarded to the output selector circuit 17. The compensated digital output signals $\tilde{x}_0(k)$, $\tilde{x}_1(k)$ are recombined by the output selector circuit 17 (step S6).

For example, the output selector circuit 17 selectively outputs a signal associated with the first signal path 20, i.e., the first compensated digital output signal $\tilde{x}_0(k)$, and a signal associated with the second signal path 22, i.e., the second compensated digital output signal $\tilde{x}_1(k)$, in an alternating manner. The resulting digital output signal x(k) is sampled at a higher sampling rate than achievable by a single ADC.

The digital output signal x(k) is forwarded to the overall equalizer sub-circuit 36. The digital output signal x(k) is filtered by the overall equalizer sub-circuit 36, thereby compensating transfer function mismatches originating upstream of the primary sampler circuit 12 (step S7). As a result, a compensated digital output signal x̃(k) with reduced perturbations due to transfer function mismatches is obtained.

In some embodiments, time variant perturbations due to time variant transfer function mismatches can be reduced or even removed, such that the compensated digital output signal x̃(k) bears reduced or no time variant perturbations due to transfer function mismatches.

Figure 3:
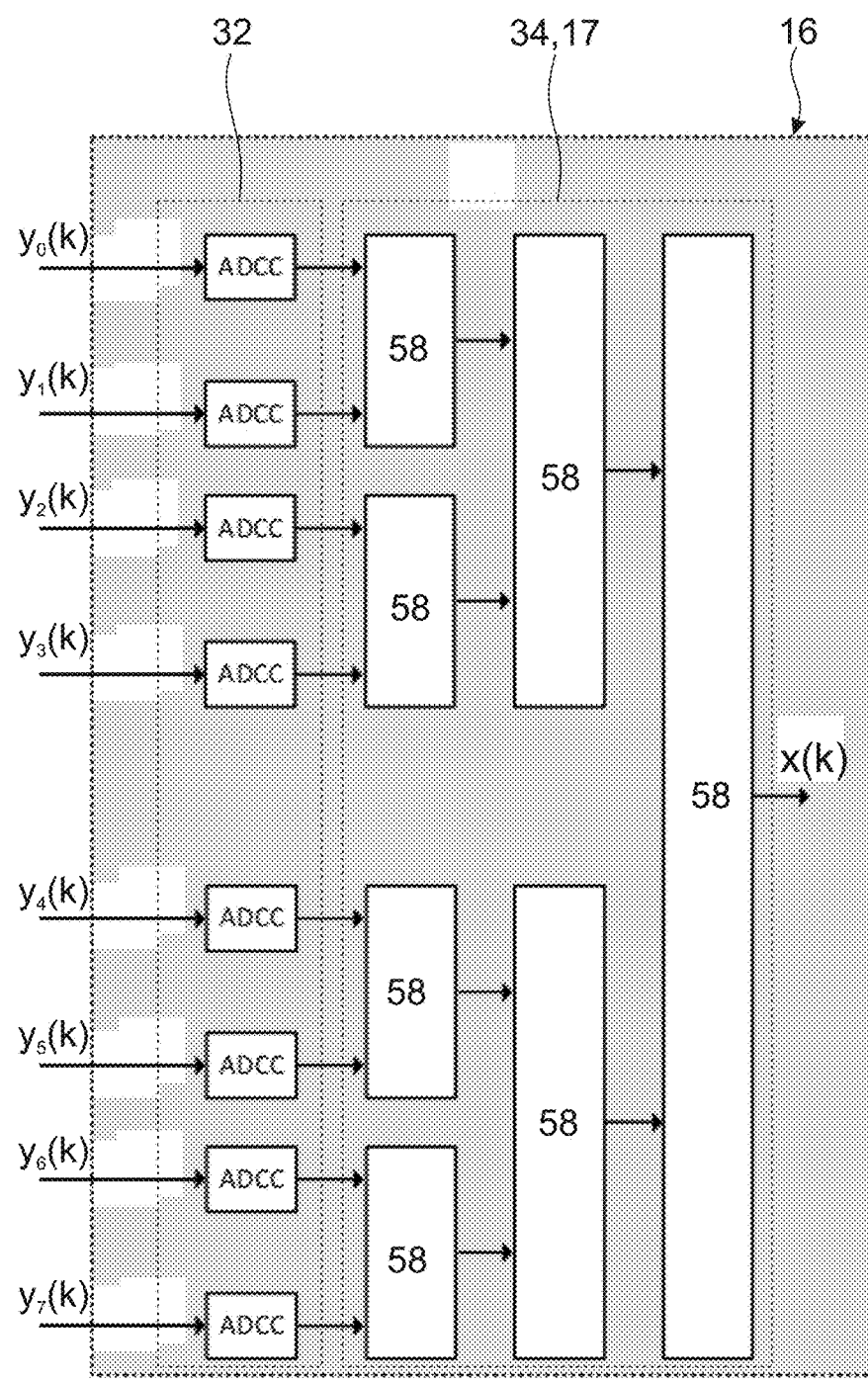
FIG. 3 shows an example of equalization circuit of the phase-shifted sampling circuit of FIG. 1 according to an embodiment of the present disclosure.

FIG. 3 shows another embodiment of the equalization circuit 16, or more precisely of the ADC equalizer sub-circuit 32, the primary sampler equalizer sub-circuit 34, and the output selector circuit 17. It is noted that the overall equalizer sub-circuit 36 is not shown in FIG. 3, but would be provided downstream of the primary sampler equalizer sub-circuit 34 and the output selector circuit 17.

In the certain example of FIG. 3, the equalization circuit 16 is configured for a primary sampler circuit 12 having eight signal paths. Accordingly, the ADC equalizer sub-circuit 32 comprises eight ADC filter units (denoted as "ADCC" in FIG. 3). Optionally, the ADC equalizer sub-circuit 32 may comprise an adder unit (not shown in FIG. 3) upstream of each ADC filter unit, wherein the adder units are each configured to compensate offset errors.

The overall equalizer sub-circuit 36 and the output selector circuit 17 are established, for example, by several linear 2-periodic time variant filters 58. In general, the 2-periodic time variant filters 58 are arranged in a structure resembling the internal structure of the primary sampler circuit 12. For example, the 2-periodic time variant filters 58 are arranged in a tree-like structure, as the primary sampler circuit 12 typically also has a tree-like structure.

In some embodiments, the structure of the 2-periodic time variant filters 58 is a mirrored version of the internal structure of the primary sampler circuit 12.

It has turned out that a particularly resource-efficient compensation of the transfer function mismatches between the signal paths 20, 22 of the primary sampler circuit 12 is obtained in this way.

Figure 4:
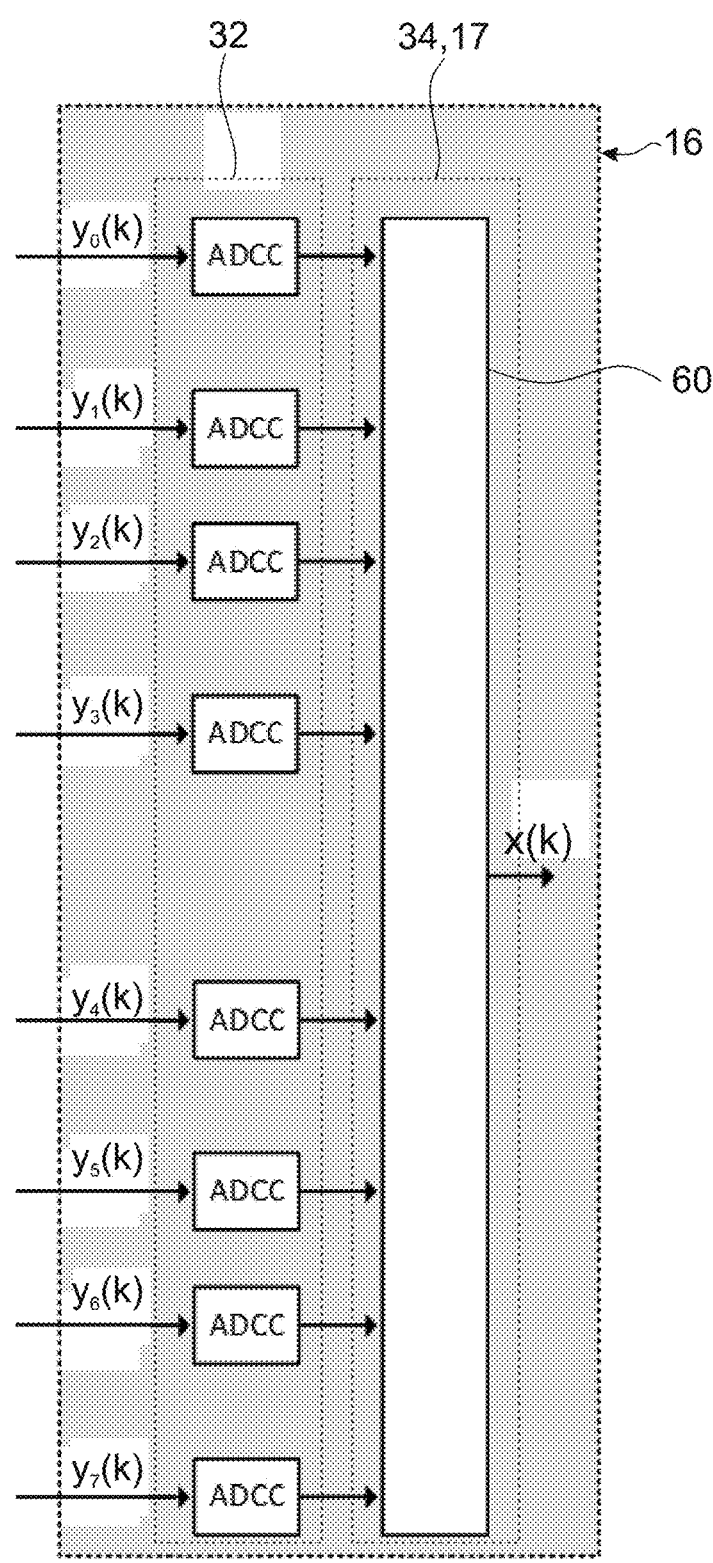
FIG. 4 shows another example of an equalization circuit of the phase-shifted sampling circuit of FIG. 1 according to an embodiment of the present disclosure.

FIG. 4 shows another embodiment of the equalization circuit 16, or more precisely of the ADC equalizer sub-circuit 32, the primary sampler equalizer sub-circuit 34, and the output selector circuit 17. It is noted that the overall equalizer sub-circuit 36 is not shown in FIG. 4, but would be provided downstream of the primary sampler equalizer sub-circuit 34 and the output selector circuit 17.

In the certain example of FIG. 4, the equalization circuit 16 is configured for a primary sampler circuit 12 having eight signal paths. Accordingly, the ADC equalizer sub-circuit 32 comprises eight ADC filter units (denoted as "ADCC in FIG. 4). Optionally, the ADC equalizer sub-circuit 32 may comprise an adder unit (not shown in FIG. 4) upstream of each ADC filter unit, wherein the adder units are each configured to compensate offset errors.

The overall equalizer sub-circuit 36 and the output selector circuit 17 are established, for example, by a single 8-periodic time variant filter 60. It is noted that this structure can be generalized to an arbitrary number of n signal paths. In this case, the equalizer sub-circuit 36 and the output selector circuit 17 are established by a single a-periodic time variant filter.

It has turned out that transfer function mismatches occurring between individual stages of the primary sampler circuit can be compensated in this way, as the single filter structure is linked to all signal paths.

In the following, a representative method of determining filter coefficients of the equalization circuit 16 of the phase-shifted sampling circuit 10 is described with respect to FIG. 5.

Figure 5:
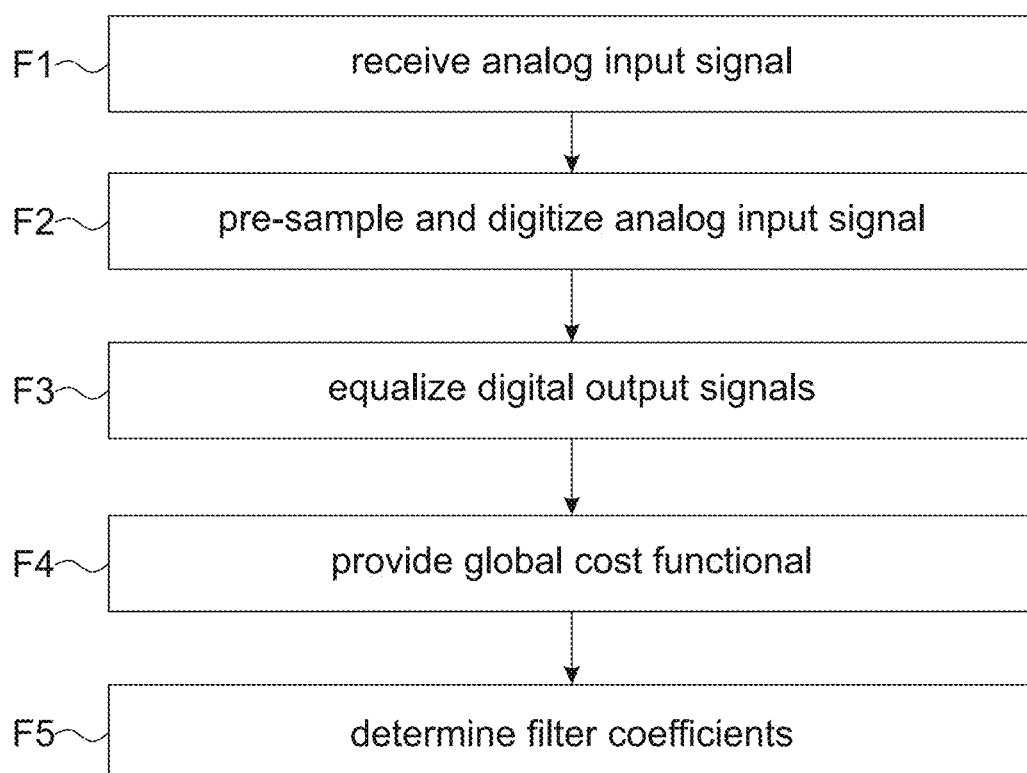
FIG. 5 shows a representative flow chart of a method of determining filter coefficients according to an embodiment of the present disclosure.

As shown in FIG. 5, the input signal x(t) is received by the analog signal input 18 (step F1).

The input signal x(t) is processed by the primary sampler circuit 12 and the ADC circuit 14 (cf. steps S2 and S3 described above), thereby obtaining at least a first digital output signal $y_0(k)$ and a second digital output signal $y_1(k)$ (step F2).

The first digital output signal $y_0(k)$ and the second digital output signal $y_1(k)$ are processed by the equalization circuit 16 (cf. steps S4 to S7 described above), thereby obtaining an equalized output signal x̃(k) (step F3).

A global cost functional is provided, wherein the global cost functional depends on filter coefficients of the individual equalizer sub-circuits 32, 34, 36, the input signal $y(n)=(y_0(n), y_1(n))$ of the equalization circuit 16, and the equalized output signal x̃(k) (step F4).

In general, the global cost functional has the following form:

$$Q = \sum_{n=0}^{N-1} (\tilde{x}(n) - \tilde{x}_{ideal}(n))^2.$$

Therein, the dependence of the global cost functional on the filter coefficients is implicit, as the equalized output signal is a function $\tilde{x}(n)=f_{ges}(b_{ges},y,n)$ of a filter coefficient vector $b_{ges}$ and of the input signal vector y. Moreover, N is the signal length (i.e., the number of samples) over which the cost functional is evaluated.

$\tilde{x}_{ideal}$ is an ideal reference signal, i.e., an ideal reconstructed signal.

Filter coefficients of the equalizer sub-circuits 32, 34, 36 are determined by a global variation of the global cost functional (step F5).

For example, the global cost functional is minimized in order to find the filter coefficients of the individual equalizer sub-circuits 32, 34, 36, i.e., $$\min_b \left\{ \sum_{n=0}^{N-1} (f_{ges}(b_{ges}, y, n) - \tilde{x}_{ideal}(n))^2 \right\}.$$

Alternatively, the maximal error may be minimized, i.e., $$\min_b \left\{ \max_n \{f_{ges}(b_{ges}, y, n) - \tilde{x}_{ideal}(n)\} \right\}.$$

Therein, the starting coefficients for the variation of the global cost functional Q are obtained by means of local variations of local cost functionals being associated with the individual equalizer sub-circuits 32, 34, 36.

Accordingly, three different local cost functionals $Q_{ADCE}$, $Q_{PSE}$, and $Q_{OSE}$, and provided for the ADC equalizer sub-circuit 32, the primary sampler equalizer sub-circuit 34, and the overall equalizer sub-circuit 36, respectively.

The local cost functionals have the following general form:

$$Q_X = \sum_{n=0}^{N-1} (x_X(n) - x_{X,ref}(n))^2,$$

wherein X can be ACDE, PSE, or OSE. Moreover, $x_X(n)$ is the actual output signal of the respective equalizer sub-circuit 32, 34, 36, and $x_{X,ref}(n)$ is the corresponding ideal output signal of the respective equalizer sub-circuit 32, 34, 36, i.e., the corresponding reference signal.

In order to obtain the starting coefficients for the global optimization, the local cost functionals $Q_X$ are minimized, i.e., $$\min_b \left\{ \sum_{n=0}^{N-1} (x_X(n) - x_{X,ref}(n))^2 \right\}.$$

Alternatively, the maximal error may be minimized, i.e., $$\min_b \left\{ \max_n \{x_X(n) - x_{X,ref}(n)\} \right\}.$$

In other words, a first optimization is performed for the equalizer sub-circuits 32, 34, 36 individually.

The results of this first optimization, i.e., preliminary filter coefficients for the equalizer sub-circuits 32, 34, 36, may then be used as starting conditions for a second optimization, namely the variation of the global cost functional Q.

It is noted that for the variations or rather optimizations described above, any suitable mathematical technique may be used, e.g. GauB-Newton or Nelder-Meat.

Certain embodiments disclosed herein utilize circuitry (e.g., one or more circuits) in order to implement protocols, methodologies or technologies disclosed herein, operably couple two or more components, generate information, process information, analyze information, generate signals, encode/decode signals, convert signals, transmit and/or receive signals, control other devices, etc. Circuitry of any type can be used. It will be appreciated that the term "information" can be use synonymously with the term "signals" in this paragraph. It will be further appreciated that the terms "circuitry," "circuit," "one or more circuits," etc., can be used synonymously herein.

In an embodiment, circuitry includes, among other things, one or more computing devices such as a processor (e.g., a microprocessor), a central processing unit (CPU), a digital signal processor (DSP), an application-specific integrated circuit (ASIC), a field-programmable gate array (FPGA), a system on a chip (SoC), or the like, or any combinations thereof, and can include discrete digital or analog circuit elements or electronics, or combinations thereof.

In an embodiment, circuitry includes hardware circuit implementations (e.g., implementations in analog circuitry, implementations in digital circuitry, and the like, and combinations thereof). In an embodiment, circuitry includes combinations of hardware circuits and computer program products having software or firmware instructions stored on one or more computer readable memories that work together to cause a device to perform one or more protocols, methodologies or technologies described herein. In an embodiment, circuitry includes circuits, such as, for example, microprocessors or portions of microprocessor, that require software, firmware, and the like for operation. In an embodiment, circuitry includes one or more processors, such as, for example, microprocessors, or portions thereof and accompanying software, firmware, hardware, and the like.

In some examples, the functionality described herein can be implemented by special purpose hardware-based computer systems or circuits, etc., or combinations of special purpose hardware and computer instructions. Each of these special purpose hardware-based computer systems or circuits, etc., or combinations of special purpose hardware circuits and computer instructions form specifically configured circuits, devices, etc., capable of implemented the functionality described herein.

Various embodiments are described above with reference to block diagrams and/or flowchart illustrations of apparatuses, methods, systems, and/or computer program instructions or program products. It should be understood that each block of any of the block diagrams and/or flowchart illustrations, respectively, of portions thereof, may be implemented in part by computer program instructions, e.g., as logical steps or operations executing on one or more computing devices. These computer program instructions may be loaded onto one or more computer or computing devices, such as special purpose computer(s) or computing device(s) or other programmable data processing apparatus(es) to produce a specifically-configured machine, such that the instructions which execute on one or more computer or computing devices or other programmable data processing apparatus implement the functions specified in the flowchart block or blocks and/or carry out the methods described herein.

These computer program instructions may also be stored in one or more computer-readable memory or portions thereof, that can direct one or more computers or computing devices or other programmable data processing apparatus (es) to function in a particular manner, such that the instructions stored in the computer-readable memory produce an article of manufacture including computer-readable instructions for implementing the functionality specified in the flowchart block or blocks.

It will be appreciated that the term computer or computing device can include, for example, any computing device or processing structure, including but not limited to a processor (e.g., a microprocessor), a central processing unit (CPU), a digital signal processor (DSP), an application-specific integrated circuit (ASIC), a field-programmable gate array (FPGA), a system on a chip (SoC), or the like, or any combinations thereof.

Accordingly, blocks of the block diagrams and/or flowchart illustrations support various combinations for performing the specified functions, combinations of operations for performing the specified functions and program instructions for performing the specified functions. Again, it should also be understood that each block of the block diagrams and flowchart illustrations, and combinations of blocks in the block diagrams and/or flowchart illustrations, or portions thereof, could be implemented by special purpose hardware-based computer systems or circuits, etc., that perform the specified functions or operations, or combinations of special purpose hardware and computer instructions.

Of course, in some embodiments, two or more of these components, or parts thereof, can be integrated or share hardware and/or software, circuitry, etc. In some embodiments, these components, or parts thereof, may be grouped in a single location or distributed over a wide area. In circumstances where the components are distributed, the components are accessible to each other via communication links.

In the foregoing description, specific details are set forth to provide a thorough understanding of representative embodiments of the present disclosure. It will be apparent to one skilled in the art, however, that the embodiments disclosed herein may be practiced without embodying all of the specific details. In some instances, well-known process steps have not been described in detail in order not to unnecessarily obscure various aspects of the present disclosure. Further, it will be appreciated that embodiments of the present disclosure may employ any combination of features described herein.

Throughout this specification, terms of art may be used. These terms are to take on their ordinary meaning in the art from which they come, unless specifically defined herein or the context of their use would clearly suggest otherwise.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A and B" is equivalent to "A and/or B" or vice versa, namely "A" alone, "B" alone or "A and B.". Similarly, the phrase "at least one of A, B, and C," for example, means (A), (B), (C), (A and B), (A and C), (B and C), or (A, B, and C), including all further possible permutations when greater than three elements are listed.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A phase-shifted sampling circuit, comprising:
   a primary sampler circuit including an analog signal input, a first signal path, and a second signal path, wherein the first signal path comprises a first analog sampling unit configured to sample an analog input signal received by the analog signal input, thereby generating a first pre-sampled analog input signal, and wherein the second signal path comprises a second analog sampling unit configured to sample the analog input signal in a phase-shifted manner compared to the first analog sampling unit, thereby generating a second pre-sampled analog input signal, wherein the first pre-sampled analog input signal and the second pre-sampled analog input signal each have a lower bandwidth than the analog input signal;
   an analog-to-digital converter (ADC) circuit including a first analog-to-digital converter associated with the first signal path, wherein the first analog-to-digital converter is configured to sample the first pre-sampled analog input signal, thereby generating a first digital output signal, and including a second analog-to-digital converter associated with the second signal path, wherein the second analog-to-digital converter is configured to sample the second pre-sampled analog input signal in a phase-shifted manner compared to the first analog-to-digital converter, thereby generating a second digital output signal; and
   an equalization circuit including a primary sampler equalizer sub-circuit, wherein the primary sampler equalizer sub-circuit is configured to compensate a mismatch between a transfer function associated with the first signal path and a transfer function associated with the second signal path based on the digital output signals, wherein the primary sampler equalizer sub-circuit is configured to compensate transfer function mismatches originating within the primary sampler circuit, and wherein filter coefficients of the primary sampler equalizer circuit are chosen such that deviations of sampling times of the first analog sampling unit and of the second analog sampling unit from respective ideal sampling times are compensated.

2. The phase-shifted sampling circuit according to claim 1, wherein the primary sampler equalizer sub-circuit is established as a linear periodic time variant (LPTV) filter.

3. The phase-shifted sampling circuit according to claim 2, wherein the primary sampler equalizer sub-circuit comprises at least two inputs and at least two outputs, wherein the primary sampler equalizer sub-circuit comprises filter units connecting each input with each output.

4. The phase-shifted sampling circuit according to claim 3, wherein the filter units are established as finite impulse response (FIR) filter units.

5. The phase-shifted sampling circuit according to claim 1, wherein the equalization circuit comprises an ADC equalizer sub-circuit and/or an overall equalizer sub-circuit,
   wherein the ADC equalizer sub-circuit is configured to compensate transfer function mismatches within the ADC circuit and/or transfer function mismatches in a connection path between the primary sampler circuit and the ADC circuit, and
   wherein the overall equalizer sub-circuit is configured to compensate transfer function mismatches originating upstream of the primary sampler circuit.

6. The phase-shifted sampling circuit according to claim 5, wherein the ADC equalizer sub-circuit is provided upstream of the primary sampler equalizer sub-circuit or immediately upstream of the primary sampler equalizer sub-circuit, and/or wherein the overall equalizer sub-circuit is provided downstream of the primary sampler equalizer sub-circuit.

7. The phase-shifted sampling circuit according to claim 5, wherein filter coefficients of the equalizer sub-circuits are obtained by a variation of a global cost function, wherein the global cost function depends on the filter coefficients of the individual equalizer sub-circuits.

8. The phase-shifted sampling circuit according to claim 7, wherein starting coefficients for the variation of the global cost function are obtained by local variations of local cost functions being associated with the individual equalizer sub-circuits.

9. The phase-shifted sampling circuit according to claim 7, wherein the variation is performed by a least squares technique.

10. The phase-shifted sampling circuit according to claim 1, wherein the phase-shifted sampling circuit comprises an output selector circuit configured to selectively output a signal associated with the first signal path or with the second signal path.

11. The phase-shifted sampling circuit according to claim 10, wherein the output selector circuit is configured to selectively output the signal associated with the first signal path and the signal associated with the second signal path in an alternating manner.

12. The phase-shifted sampling circuit according to claim 10, wherein the output selector circuit is arranged downstream of the primary sampler equalizer sub-circuit or immediately downstream of the primary sampler equalizer sub-circuit.

13. The phase-shifted sampling circuit according to claim 1, wherein the primary sampler equalizer sub-circuit has a structure resembling the structure of the primary sampler circuit or a tree-like structure.

14. The phase-shifted sampling circuit according to claim 1, wherein the primary sampler equalizer sub-circuit has a single filter structure being associated with all signal paths.

15. The phase-shifted sampling circuit according to claim 14, wherein the single filter structure is a single linear n-periodic time variant filter, wherein n is an integer greater than or equal to 2.

16. The phase-shifted sampling circuit according to claim 1, wherein the analog sampling units are established as sample & hold units, as track & hold units, or as return-to-zero sampling units.

17. A measurement instrument, comprising a phase-shifted sampling circuit according to claim 1.

18. The measurement instrument of claim 17, wherein the measurement instrument is established as an oscilloscope.

19. A method of determining filter coefficients of an equalization circuit of a phase-shifted sampling circuit according to claim 1, wherein the equalization circuit includes an analog-to-digital converter (ADC) equalizer sub-circuit configured to compensate transfer function mismatches within an ADC circuit and/or an overall equalizer sub-circuit configured to compensate transfer function mismatches originating upstream of a primary sampler circuit, the method comprising the following steps:
receiving an input signal;
processing the input signal by the primary sampler circuit and the ADC circuit, thereby obtaining at least a first digital output signal and a second digital output signal;
processing the first digital output signal and the second digital output signal by the equalization circuit, thereby obtaining an equalized output signal;
providing a global cost function that depends on filter coefficients of the individual equalizer sub-circuits, the input signal, and the equalized output signal; and
determining the filter coefficients of the equalizer sub-circuits by a global variation of the global cost function.

20. The method according to claim 19, wherein starting coefficients for the variation of the global cost function are obtained by local variations of local cost functions associated with the individual equalizer sub-circuits.

* * * * *